United States Patent
Hamada et al.

(10) Patent No.: US 12,138,926 B2
(45) Date of Patent: Nov. 12, 2024

(54) PIEZOELECTRIC SUBSTRATE, PIEZOELECTRIC ELEMENT AND LIQUID EJECTION HEAD

(71) Applicant: SEIKO EPSON CORPORATION, Tokyo (JP)

(72) Inventors: Yasuaki Hamada, Nagano (JP); Tomohiro Sakai, Nagano (JP); Toshihiro Shimizu, Fujimi-machi (JP); Masao Nakayama, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 196 days.

(21) Appl. No.: 18/069,270

(22) Filed: Dec. 21, 2022

(65) Prior Publication Data

US 2023/0202173 A1 Jun. 29, 2023

(30) Foreign Application Priority Data

Dec. 23, 2021 (JP) ................... 2021-209176

(51) Int. Cl.
*B41J 2/14* (2006.01)
*H10N 30/00* (2023.01)
*H10N 30/20* (2023.01)
*H10N 30/853* (2023.01)

(52) U.S. Cl.
CPC ...... *B41J 2/14201* (2013.01); *H10N 30/2047* (2023.02); *H10N 30/708* (2024.05); *H10N 30/8542* (2023.02); *B41J 2002/14306* (2013.01)

(58) Field of Classification Search
CPC .......... B41J 2/14201; B41J 2002/14306; B41J 2/161; H10N 30/2047; H10N 30/8542; H10N 30/708
See application file for complete search history.

(56) References Cited

U.S. PATENT DOCUMENTS

| | | | |
|---|---|---|---|
| 2011/0216133 A1* | 9/2011 | Hamada | C04B 35/6264 310/357 |
| 2018/0138393 A1* | 5/2018 | Sumi | H10N 30/877 |
| 2018/0277741 A1 | 9/2018 | Kitada | |

FOREIGN PATENT DOCUMENTS

JP 2018-160535 A 10/2018

* cited by examiner

*Primary Examiner* — Thinh H Nguyen
(74) *Attorney, Agent, or Firm* — Global IP Counselors, LLP

(57) ABSTRACT

A piezoelectric substrate includes: a substrate; a first electrode formed on the substrate; and a piezoelectric layer formed on the first electrode and containing potassium, sodium, and niobium. A full width at half maximum of an X-ray intensity peak on a plane (100) of the piezoelectric layer in a Psi axis-direction scan result of an X-ray diffraction measurement in which a surface of the piezoelectric layer is irradiated with X-rays at an angle of 54.74° from a direction perpendicular to the surface is more than 0° and 1.2° or less.

7 Claims, 8 Drawing Sheets

PIEZOELECTRIC SUBSTRATE, PIEZOELECTRIC ELEMENT AND LIQUID EJECTION HEAD

The present application is based on, and claims priority from JP Application Serial Number 2021-209176, filed Dec. 23, 2021, the disclosure of which is hereby incorporated by reference herein in its entirety.

BACKGROUND

1. Technical Field

The present disclosure relates to a piezoelectric substrate, a piezoelectric element, and a liquid ejection head.

2. Related Art

A piezoelectric element is used in various fields such as a liquid ejection head of an inkjet printer and a sensor. As a piezoelectric material, for example, potassium sodium niobate or lead zirconate titanate is used. The piezoelectric element is operated by disposing a piezoelectric material between a pair of electrodes and applying an electric field to the piezoelectric material by the electrodes.

For example, JP-A-2018-160535 discloses a piezoelectric element which uses a piezoelectric material containing potassium, sodium, and niobium, and in which a piezoelectric layer is preferentially oriented in (100).

However, in the piezoelectric element disclosed in JP-A-2018-160535, film formation cracking is likely to occur. When moisture enters a film formation cracking portion, an insulation property of the piezoelectric element is reduced, and therefore, when the piezoelectric element is operated in the air atmosphere, piezoelectric characteristics may be reduced as compared with that when the piezoelectric element is operated in a dry atmosphere.

SUMMARY

A piezoelectric substrate according to an aspect of the present disclosure includes: a substrate; a first electrode formed on the substrate; and a piezoelectric layer formed on the first electrode and containing potassium, sodium, and niobium, and a full width at half maximum of an X-ray intensity peak on a plane (100) of the piezoelectric layer in a Psi axis-direction scan result of an X-ray diffraction measurement in which a surface of the piezoelectric layer is irradiated with X-rays at an angle of 54.74° from a direction perpendicular to the surface is more than 0° and 1.2° or less.

A piezoelectric element according to an aspect of the present disclosure includes: the above piezoelectric substrate; and a second electrode formed on the piezoelectric layer.

A liquid ejection head according to an aspect of the present disclosure includes: the above piezoelectric element; a flow path formation substrate provided with a pressure generation chamber whose capacity is changed by the piezoelectric element; and a nozzle plate provided with a nozzle hole that is in communication with the pressure generation chamber.

DESCRIPTION OF EXEMPLARY EMBODIMENTS

Hereinafter, embodiments of the present disclosure will be described. The embodiment to be described later is used for describing examples of the present disclosure. The present disclosure is not limited to the following embodiments at all, and includes various modifications implemented without departing from the gist of the present disclosure. Not all configurations to be described below are necessarily essential configurations of the present disclosure.

1. Piezoelectric Substrate

A piezoelectric substrate according to the present embodiment includes a substrate, a first electrode formed on the substrate, and a piezoelectric layer formed on the first electrode and containing potassium, sodium, and niobium.

1.1. Configuration

Figure 1:
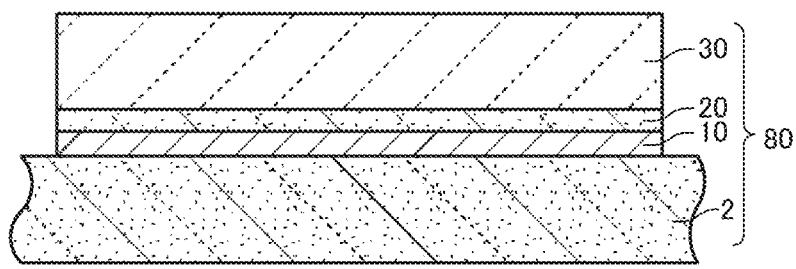
FIG. 1 is a cross-sectional view schematically showing a piezoelectric substrate according to an embodiment.

First, a piezoelectric element according to the present embodiment will be described with reference to the drawings. FIG. 1 is a cross-sectional view schematically showing a piezoelectric substrate 80 according to the present embodiment.

The piezoelectric substrate 80 includes a base 2, a first electrode 10, a seed layer 20, and a piezoelectric layer 30, as shown in FIG. 1.

The base 2 is, for example, a flat plate made of a semiconductor, an insulator, and the like. The base 2 may be a single layer or a stack body in which a plurality of layers are stacked. An internal structure of the base 2 is not limited as long as an upper surface thereof has a planar shape, and the base 2 may have a structure in which a space or the like is formed therein. The base 2 can be, for example, a silicon substrate.

The base 2 may include a vibrating plate that is flexible and that deforms when the piezoelectric layer 30 is operated. The vibrating plate is, for example, a silicon oxide layer, a zirconium oxide layer, or a stack body in which a zirconium oxide layer is provided on a silicon oxide layer.

The first electrode 10 is provided on the base 2. The first electrode 10 is provided between the base 2 and the seed layer 20. A shape of the first electrode 10 is, for example, layered. A thickness of the first electrode 10 is, for example, 3 nm or more and 300 nm or less. The first electrode 10 is, for example, a metal layer such as a platinum layer, an iridium layer, a titanium layer, and a ruthenium layer, and may be a conductive oxide layer thereof, a lanthanum nickelate ($LaNiO_3$:LNO) layer, a strontium ruthenate ($SrRuO_3$:SRO) layer, and the like as long as sufficient conductivity is obtained. The first electrode 10 may have a structure in which the plurality of layers exemplified above are stacked.

The first electrode 10 can function as one electrode for applying a voltage to the piezoelectric layer 30. The first electrode 10 is a lower electrode provided below the piezoelectric layer 30.

The seed layer 20 is provided on the first electrode 10. The seed layer 20 is provided between the first electrode 10 and the piezoelectric layer 30. Although not shown, the seed layer 20 may be provided on at least one of the first electrode 10 and the base 2.

When the conductive oxide layer (such as the lanthanum nickelate ($LaNiO_3$:LNO) layer and the strontium ruthenate ($SrRuO_3$:SRO) layer) is provided on an upper surface of the first electrode 10, the conductive oxide layer may be used as the seed layer 20. In addition, even when the conductive oxide layer is provided on the upper surface of the first electrode 10, the seed layer 20 may also be formed on the conductive oxide layer.

A thickness of the seed layer 20 is, for example, 5 nm or more and 50 nm or less, preferably 10 nm or more and 40 nm or less, and more preferably 20 nm or more and 30 nm or less. The seed layer 20 can function as an orientation control for controlling a crystal orientation of the piezoelectric layer 30, as will be described later.

A material of the seed layer 20 is not particularly limited as long as being a material capable of controlling the crystal orientation when a material of the piezoelectric layer 30 is crystallized, and examples thereof include an oxide containing strontium and ruthenium, an oxide containing lanthanum and nickel, and an oxide containing strontium and titanium. The material of the seed layer 20 more preferably contains strontium and ruthenium. In this way, it becomes easier to make the crystal orientation of a piezoelectric material of the piezoelectric layer 30 have properties to be described later. Accordingly, an effect that a stress due to a difference in thermal expansion coefficients is less likely to be generated in the piezoelectric layer 30, and breakage and cracking are less likely to occur is more remarkably shown.

The piezoelectric layer 30 is provided on the seed layer 20. Although not shown, the piezoelectric layer 30 may be provided on the first electrode 10, the seed layer 20 and/or the base 2. A thickness of the piezoelectric layer 30 is, for example, 100 nm or more and 3 μm or less. The piezoelectric layer 30 can be deformed by applying a voltage.

The piezoelectric layer 30 has a perovskite structure. The piezoelectric layer 30 contains potassium (K), sodium (Na), and niobium (Nb). In the present specification, a material containing potassium (K), sodium (Na), and niobium (Nb) may be referred to as KNN. In the piezoelectric layer 30, a ratio DA/DB of an atomic concentration DA at a site A to an atomic concentration DB at a site B of the perovskite structure is, for example, 1.01 or more and 1.10 or less, preferably 1.02 or more and 1.06 or less. When the piezoelectric layer 30 is KNN, in the piezoelectric layer 30, a total of the number of potassium atoms and the number of sodium atoms is more than the number of niobium atoms by, for example, 1% or more and 10% or less, preferably 2% or more and 6% or less.

1.2. Crystal Orientation of Piezoelectric Material

The piezoelectric layer 30 of the piezoelectric substrate 80 according to the present embodiment has the following features. That is, in the piezoelectric layer 30, a full width at half maximum of an X-ray intensity peak on a plane (100) of the piezoelectric layer 30 in a Psi axis-direction scan result of an X-ray diffraction measurement is more than 0° and 1.2° or less.

The full width at half maximum of the X-ray intensity peak on the plane (100) of the piezoelectric layer 30 in the Psi axis-direction scan result of the X-ray diffraction measurement is more preferably 0.2° or more and 1.1° or less, and still more preferably 0.3° or more and 1.1° or less.

The full width at half maximum of the X-ray intensity peak on the plane (100) in the Psi axis-direction scan result of the X-ray diffraction measurement changes in relation to variation in a crystal grain orientation in a plurality of crystal grains. When the full width at half maximum of the X-ray intensity peak on the plane (100) in the Psi axis-direction scan result of the X-ray diffraction measurement is more than 0° and 1.2° or less, it is shown that directions in which the plurality of crystal grains of the KNN are oriented are relatively aligned.

By adopting such a crystal grain arrangement in the piezoelectric layer 30, a difference in the thermal expansion coefficients due to a crystal orientation direction is small, a stress due to the difference in the thermal expansion coefficients at a time of temperature change is less likely to be generated, and the breakage and the cracking are less likely to occur.

In the piezoelectric layer 30, a full width at half maximum of an X-ray intensity peak on the plane (100) of the piezoelectric layer 30 in a 2θ-ω scan result of the X-ray diffraction measurement is more preferably 0.3° or more and 0.5° or less. In addition, a full width at half maximum of an X-ray intensity peak corresponding to a plane (111) in a 2θ-ω scan result of an X-ray diffraction measurement in which a KNN film surface of the piezoelectric layer 30 is irradiated with X-rays at an angle of 54.74° from a direction perpendicular to the KNN film surface is preferably 0.33° or more and 0.95° or less.

The full width at half maximum of the X-ray intensity peak on the plane (100) of the piezoelectric layer 30 in the 2θ-ω scan result of the X-ray diffraction measurement changes in relation to variation in a lattice constant in the crystal. The full width at half maximum of the X-ray intensity peak on the plane (100) of the piezoelectric layer 30 in the 2θ-ω scan result of the X-ray diffraction measurement relates to variation in lattice constants of the plurality of crystal grains and variation in a lattice constant of one crystal grain. When the full width at half maximum of the X-ray intensity peak on the plane (100) of the piezoelectric layer 30 in the 2θ-ω scan result of the X-ray diffraction measurement is 0.3° or more and 0.5° or less, it is shown that the lattice constants of the crystal grains of the KNN included in the piezoelectric layer 30 are relatively uniform.

When the lattice constants of the crystal grains of the KNN included in the piezoelectric layer 30 are relatively uniform, a displacement amount of the piezoelectric substrate 80 can be further improved when the piezoelectric substrate 80 is used as a piezoelectric element.

1.3. Operation and Effect or the Like

A KNN thin film in the related art in which the full width at half maximum of the X-ray intensity peak on the plane (100) of the piezoelectric layer 30 in the Psi axis-direction scan result of the X-ray diffraction measurement is about 5° to 8° is not sufficiently dense as (100)-oriented crystals. Therefore, a component having another orientation, in particular, (111)-oriented KNN crystals are likely to grow from gaps of the crystals. Therefore, the difference in the thermal expansion coefficients due to a crystal orientation is large, and a stress due to a difference in thermal expansion coefficients is likely to be generated at a boundary between a (100)-oriented component and a (111)-oriented component due to a temperature change in a heat treatment or the like, which is likely to lead to breakage and cracking. In addition, when the crystals are not sufficiently dense, large crystal grain boundaries are likely to be generated, but in the case of KNN, potassium and sodium, which are alkali metals, are likely to segregate at the crystal grain boundaries. The segregated potassium and sodium are not in a stable state and are likely to be ionized by reacting with water in the air, which may cause insulation failure. When an insulation property of the KNN thin film is poor, a dielectric loss increases, and thus sufficient piezoelectric characteristics cannot be exhibited in some cases.

On the other hand, in the piezoelectric substrate 80 according to the embodiment, the full width at half maximum of the X-ray intensity peak on the plane (100) of the piezoelectric layer 30 in the Psi axis-direction scan result of the X-ray diffraction measurement is more than 0° and 1.2° or less. In the piezoelectric substrate 80 according to the present embodiment, since (100)-orientated crystals are densely arranged, growth of (111)-orientated KNN crystals entering between the (100)-orientated KNN crystals is inhibited, and stress concentration is less likely to occur.

For example, when the full width at half maximum of the X-ray intensity peak on the plane (111) of the piezoelectric layer 30 in the scan Psi axis-direction result of the X-ray diffraction measurement in which the surface of the piezoelectric layer 30 is irradiated X-rays at the angle of 54.74° from the direction perpendicular to the surface is more than 23°, preferably more than 25°, and more preferably more than 27°, the growth of the (111)-orientated KNN crystals entering between the (100)-orientated KNN crystals is likely to be inhibited. Therefore, when a small amount of (111)-orientated KNN components whose crystal growth is inhibited enters between the (100)-orientated KNN crystals, a strain due to a difference in lattice constants between the (100)-orientated KNN crystals and a lower layer is appropriately relaxed, and thus a stress due to mismatch of the lattice constants is less likely to be generated. Due to these mechanisms, the piezoelectric substrate 80 according to the present embodiment is less likely to break or crack.

2. Piezoelectric Element

A piezoelectric element 100 according to the present embodiment includes the base 2, the first electrode 10, the seed layer 20 formed at the first electrode 10, the piezoelectric layer 30 that is formed at the seed layer 20 and that contains potassium, sodium, and niobium, and a second electrode 40 formed at the piezoelectric layer 30.

Figure 2:
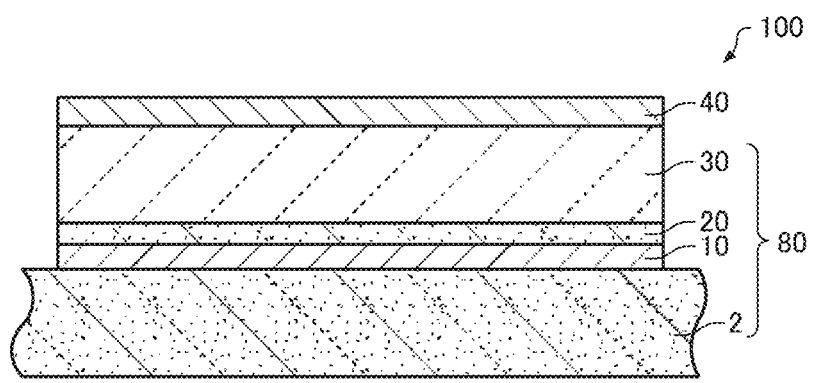
FIG. 2 is a cross-sectional view schematically showing a piezoelectric element according to the embodiment.

First, the piezoelectric element according to the present embodiment will be described with reference to the drawings. FIG. 2 is a cross-sectional view schematically showing the piezoelectric element 100 according to the present embodiment.

As shown in FIG. 2, the piezoelectric element 100 includes the base 2, the first electrode 10, the seed layer 20, the piezoelectric layer 30, and the second electrode 40.

The base 2, the first electrode 10, the seed layer 20, and the piezoelectric layer 30 are all the same as those of the piezoelectric substrate 80, and thus are denoted by the same reference numerals, and detailed descriptions thereof are omitted.

The second electrode 40 is provided on the piezoelectric layer 30. Although not shown, the second electrode 40 may be provided on a side surface of the piezoelectric layer 30 and on the base 2 as long as the second electrode 40 is electrically separated from the first electrode 10.

A shape of the second electrode 40 is, for example, layered. A thickness of the second electrode 40 is, for example, 3 nm or more and 300 nm or less. The second electrode 40 is, for example, a metal layer such as an iridium layer, a platinum layer, a titanium layer, and a ruthenium layer, a conductive oxide layer thereof, a lanthanum nickelate layer, and a strontium ruthenate layer. The second electrode 40 may have a structure in which the plurality of layers exemplified above are stacked.

The second electrode 40 is an electrode that is paired with the first electrode 10 to apply a voltage to the piezoelectric layer 30. The first electrode 10 is a lower electrode provided below the piezoelectric layer 30, and the second electrode 40 is an upper electrode provided on the piezoelectric layer 30.

3. Method for Manufacturing Piezoelectric Substrate and Piezoelectric Element

Next, a method for manufacturing the piezoelectric element 100 according to the present embodiment will be described with reference to the drawings.

As shown in FIG. 1, the base 2 is prepared. Specifically, a silicon oxide layer is formed by thermally oxidizing a silicon substrate. Next, a zirconium layer is formed on the silicon oxide layer by a sputtering method or the like, and the zirconium layer is thermally oxidized to form a zirconium oxide layer. Accordingly, a vibrating plate including the silicon oxide layer and the zirconium oxide layer can be formed. Through the above steps, the base 2 can be prepared.

Next, the first electrode 10 is formed on the base 2. The first electrode 10 is formed by, for example, the sputtering method or a vacuum deposition method. Next, the first electrode 10 is patterned. The patterning is performed, for example, by photolithography and etching.

Next, the seed layer 20 is formed on the first electrode 10. The seed layer 20 is formed by, for example, the sputtering method or the vacuum deposition method. Next, the seed layer 20 is patterned. The patterning is performed, for example, by photolithography and etching. The seed layer 20 may be formed by a sol-gel method or a chemical solution deposition (CSD) method such as metal organic deposition (MOD). In addition, the seed layer 20 may be patterned together with the first electrode 10 after the seed layer 20 is formed before patterning the first electrode 10.

Next, the piezoelectric layer 30 is formed on the seed layer 20. The piezoelectric layer 30 is formed by the sol-gel method or the chemical solution deposition (CSD) method such as the metal organic deposition (MOD). A method for forming the piezoelectric layer 30 will be described below.

First, for example, a metal complex containing potassium, a metal complex containing sodium, and a metal complex containing niobium are dissolved or dispersed in an organic solvent to prepare a precursor solution.

Examples of the metal complex containing potassium include potassium 2-ethylhexanoate and potassium acetate. Examples of the metal complex containing sodium include sodium 2-ethylhexanoate and sodium acetate. Examples of the metal complex containing niobium include niobium 2-ethylhexanoate, niobium ethoxide, niobium pentaethoxy, and niobium pentabutoxy. Two or more types of the metal complexes may be used in combination. For example, potassium 2-ethylhexanoate and potassium acetate may be used in combination as the metal complex containing potassium.

Examples of the solvent include propanol, butanol, pentanol, hexanol, octanol, ethylene glycol, propylene glycol, octane, decane, cyclohexane, xylene, toluene, tetrahydrofuran, acetic acid, octylic acid, 2-n-butoxyethanol, n-octane, 2-n-ethylhexane, and a mixed solvent thereof.

Next, the prepared precursor solution is applied onto the seed layer 20 by a spin coating method or the like to form a precursor layer. Next, the precursor layer is heated at, for example, 130° C. or higher and 250° C. or lower and dried for a certain period of time, and then the dried precursor layer is heated at, for example, 300° C. or higher and 450° C. or lower and held for a certain period of time, thereby degreasing the precursor layer. Next, the degreased precursor layer is crystallized by being fired at, for example, 550° C. or higher and 800° C. or lower to form a crystal layer.

Then, a series of steps from the application of the precursor solution to the firing of the precursor layer are repeated a plurality of times. Accordingly, the piezoelectric layer 30 including a plurality of crystal layers can be formed. Next, the piezoelectric layer 30 is patterned. The patterning is performed, for example, by photolithography and etching. The piezoelectric layer 30 including a single crystal layer may be formed without repeating a series of steps from the application of the precursor solution to the firing of the precursor layer a plurality of times.

A heating device used for drying and degreasing the precursor layer is, for example, a hot plate. A heating device used for firing the precursor layer is, for example, a rapid thermal annealing (RTA) device.

Through the above steps, the piezoelectric substrate 80 can be manufactured. Then, using the piezoelectric substrate 80, the piezoelectric element 100 can be manufactured as follows.

The second electrode 40 is formed on the piezoelectric layer 30 of the piezoelectric substrate 80. The second electrode 40 is formed by, for example, the sputtering method or the vacuum deposition method. Next, the second electrode 40 is patterned. The patterning is performed, for example, by photolithography and etching.

Through the above steps, the piezoelectric element 100 can be manufactured.

The patterning of the second electrode 40 and the patterning of the piezoelectric layer 30 may be performed in the same step. In addition, when the piezoelectric layer 30 includes a plurality of crystal layers, a first crystal layer of the piezoelectric layer 30 and the first electrode 10 may be patterned in the same step. Further, when the piezoelectric layer 30 includes a plurality of crystal layers, the first crystal layer of the piezoelectric layer 30, the first electrode 10, and the seed layer 20 may be patterned in the same step.

4. Liquid Ejection Head

Figure 3:
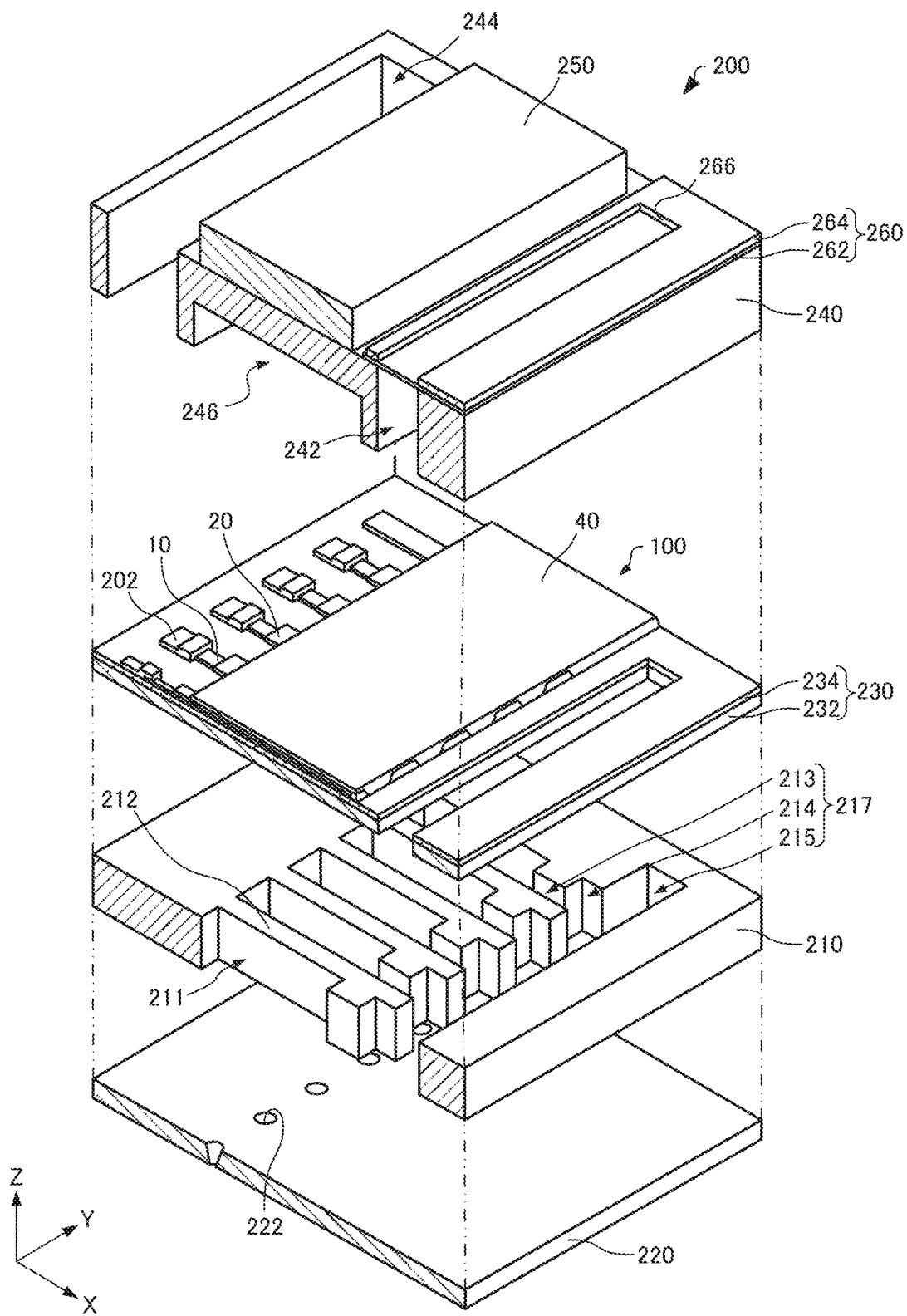
FIG. 3 is an exploded perspective view schematically showing a liquid ejection head according to the embodiment.
Figure 4:
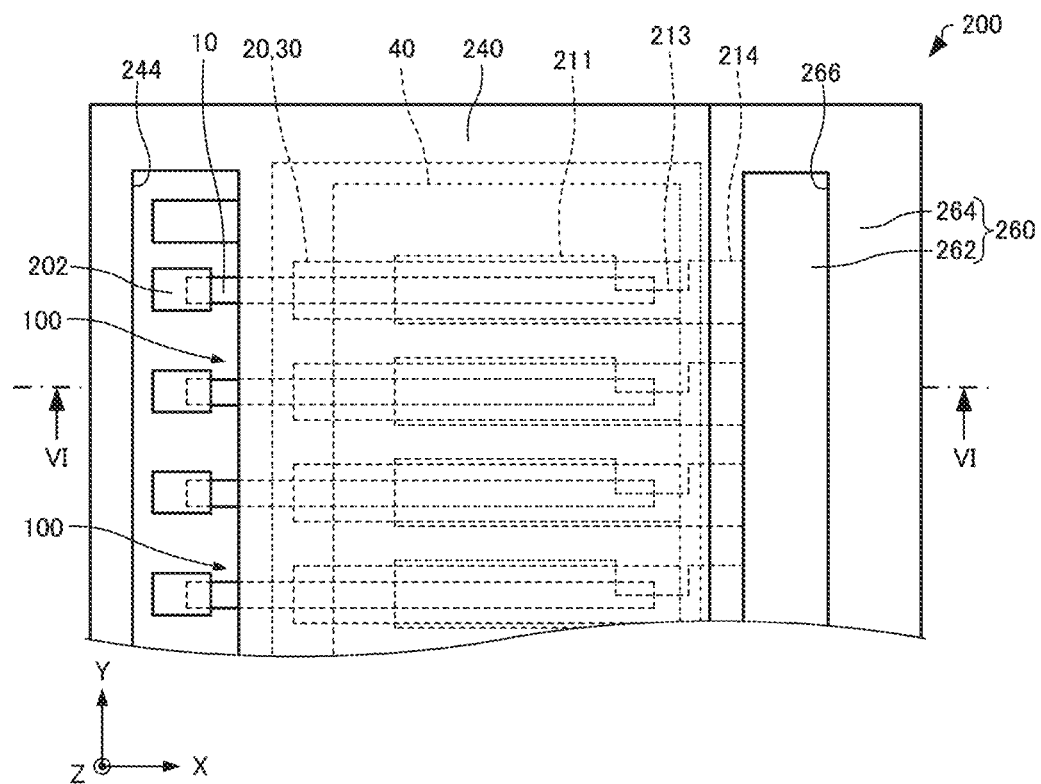
FIG. 4 is a plan view schematically showing the liquid ejection head according to the embodiment.
Figure 5:
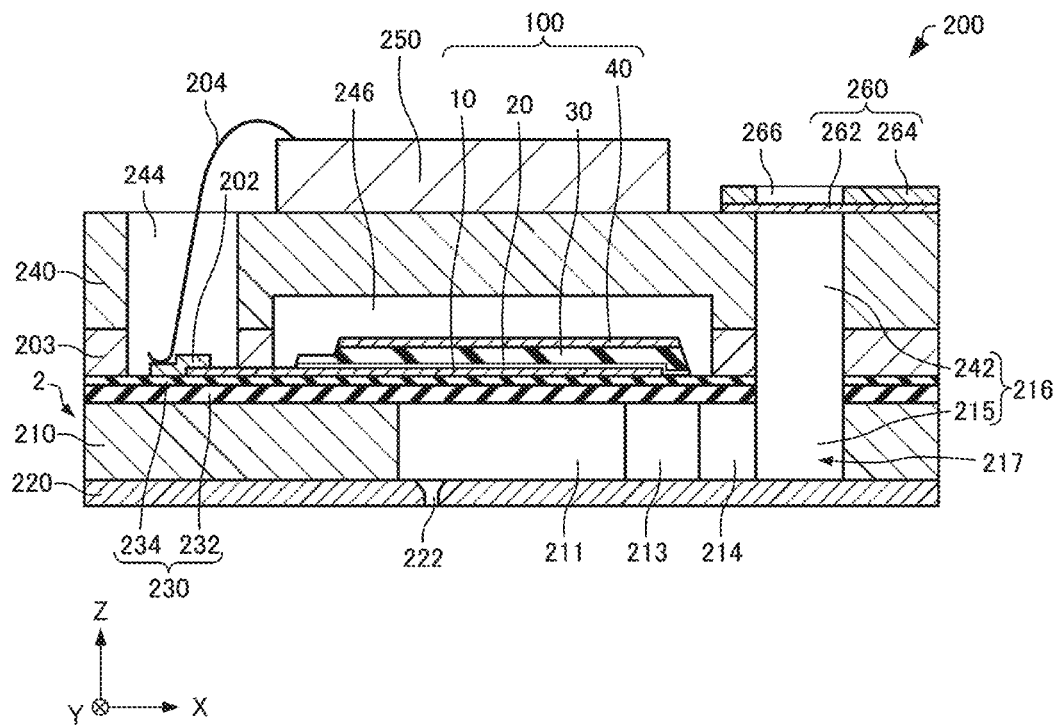
FIG. 5 is a cross-sectional view schematically showing the liquid ejection head according to the embodiment.

Next, a liquid ejection head according to the present embodiment will be described with reference to the drawings. FIG. 3 is an exploded perspective view schematically showing a liquid ejection head 200 according to the present embodiment. FIG. 4 is a plan view schematically showing the liquid ejection head 200 according to the present embodiment. FIG. 5 is a cross-sectional view taken along a line VI-VI in FIG. 4 schematically showing the liquid ejection head 200 according to the present embodiment. FIGS. 3 to 5 each show an X axis, a Y axis, and a Z axis as three axes orthogonal to one another. In addition, FIGS. 3 to 5 show the piezoelectric element 100 in a simplified manner.

The liquid ejection head 200 includes, for example, the base 2, the piezoelectric element 100, a nozzle plate 220, a protective substrate 240, a circuit substrate 250, and a compliance substrate 260, as shown in FIGS. 3 to 5. The base 2 includes a flow path formation substrate 210 and a vibrating plate 230. For convenience, illustration of the circuit substrate 250 is omitted in FIG. 4.

The flow path formation substrate 210 is, for example, a silicon substrate. The flow path formation substrate 210 is provided with pressure generation chambers 211. The pressure generation chambers 211 are separated by a plurality of partition walls 212. A capacity of the pressure generation chamber 211 is changed by the piezoelectric element 100.

First communication paths 213 and second communication paths 214 are provided at an end of the flow path formation substrate 210 in a +X-axis direction of the pressure generation chamber 211. An opening area of the first communication path 213 is reduced by narrowing an end of the pressure generation chamber 211 in the +X-axis direction from a Y-axis direction. A width of the second communication path 214 in the Y-axis direction is, for example, the same as a width of the pressure generation chamber 211 in the Y-axis direction. A third communication path 215 that is in communication with the plurality of second communication paths 214 is provided in the +X-axis direction of the second communication path 214. The third communication path 215 constitutes a part of a manifold 216. The manifold 216 serves as a common liquid chamber for the pressure generation chambers 211. As described above, the flow path formation substrate 210 is provided with the pressure generation chambers 211 and a supply flow path 217 including the first communication paths 213, the second communication paths 214, and the third communication path 215. The supply flow path 217 is in communication with the pressure generation chambers 211 and a liquid is supplied to the pressure generation chambers 211 therethrough.

The nozzle plate 220 is provided on one surface of the flow path formation substrate 210. A material of the nozzle plate 220 is, for example, steel use stainless (SUS). The nozzle plate 220 is bonded to the flow path formation substrate 210 by, for example, an adhesive or a thermal welding film. The nozzle plate 220 is provided with a plurality of nozzle holes 222 along the Y axis. The nozzle holes 222 are in communication with the pressure generation chambers 211 and the liquid is ejected therethrough.

The vibrating plate 230 is provided on the other surface of the flow path formation substrate 210. The vibrating plate 230 includes, for example, a silicon oxide layer 232 provided on the flow path formation substrate 210 and a zirconium oxide layer 234 provided on the silicon oxide layer 232.

The piezoelectric element 100 is provided, for example, on the vibrating plate 230. A plurality of the piezoelectric elements 100 are provided. The number of piezoelectric elements 100 is not particularly limited.

In the liquid ejection head 200, the vibrating plate 230 and the first electrode 10 are displaced by deformation of the piezoelectric layer 30 having electromechanical conversion characteristics. That is, in the liquid ejection head 200, the vibrating plate 230 and the first electrode 10 substantially function as a vibrating plate.

The first electrode 10 is provided as an individual electrode that is independent for each of the pressure generation chambers 211. A width of the first electrode 10 in the Y-axis direction is smaller than the width of the pressure generation chamber 211 in the Y-axis direction. A length of the first electrode 10 in an X-axis direction is larger than a length of the pressure generation chamber 211 in the X-axis direction. In the X-axis direction, both ends of the first electrode 10 are located so as to sandwich both ends of the pressure generation chamber 211. A lead electrode 202 is coupled to an end of the first electrode 10 in a −X-axis direction.

The first electrode 10 is covered with the seed layer 20. However, it is preferable that the end of the first electrode 10 on the −X-axis direction side is not covered with the seed layer 20. Since no seed layer 20 is provided between the lead electrode 202 and the first electrode 10, a decrease in conductivity can be prevented.

A width of the piezoelectric layer 30 in the Y-axis direction is, for example, larger than the width of the first electrode 10 in the Y-axis direction. A length of the piezoelectric layer 30 in the X-axis direction is, for example, larger than the length of the pressure generation chamber 211 in the X-axis direction. An end of the first electrode 10 in the +X-axis direction is located, for example, between an end of the piezoelectric layer 30 in the +X-axis direction and the end of the pressure generation chamber 211 in the +X-axis direction. The end of the first electrode 10 in the +X-axis direction is covered with the piezoelectric layer 30. On the other hand, an end of the piezoelectric layer 30 in the −X-axis direction is located, for example, between the end of the first electrode 10 on the −X-axis direction side and the end of the pressure generation chamber 211 in the −X-axis direction. The end of the first electrode 10 on the −X-axis direction side is not covered with the piezoelectric layer 30.

For example, the second electrode 40 is continuously provided on the piezoelectric layer 30 and the vibrating plate 230. The second electrode 40 is provided as a common electrode common to the plurality of piezoelectric elements 100.

The protective substrate 240 is bonded to the vibrating plate 230 by an adhesive 203. The protective substrate 240 is provided with a through hole 242. In the illustrated example, the through hole 242 penetrates the protective substrate 240 in a Z-axis direction and is in communication with the third communication path 215. The through hole 242 and the third communication path 215 constitute the manifold 216 that serves as the common liquid chamber for the pressure generation chambers 211. Further, the protective substrate 240 is provided with a through hole 244 that penetrates the protective substrate 240 in the Z-axis direction. Ends of the lead electrodes 202 are located in the through hole 244.

The protective substrate 240 is provided with an opening 246. The opening 246 is a space for not interfering with driving of the piezoelectric element 100. The opening 246 may or may not be sealed.

The circuit substrate 250 is provided on the protective substrate 240. The circuit substrate 250 includes a semiconductor integrated circuit (IC) for driving the piezoelectric element 100. The circuit substrate 250 and the lead electrodes 202 are electrically coupled to each other via coupling wirings 204.

The compliance substrate 260 is provided on the protective substrate 240. The compliance substrate 260 includes a sealing layer 262 provided on the protective substrate 240 and a fixed plate 264 provided on the sealing layer 262. The sealing layer 262 is a layer for sealing the manifold 216. The sealing layer 262 is, for example, flexible. The fixed plate 264 is provided with a through hole 266. The through hole 266 penetrates the fixed plate 264 in the Z-axis direction. The through hole 266 is provided at a position overlapping the manifold 216 when viewed from the Z-axis direction.

5. Printer

Figure 6:
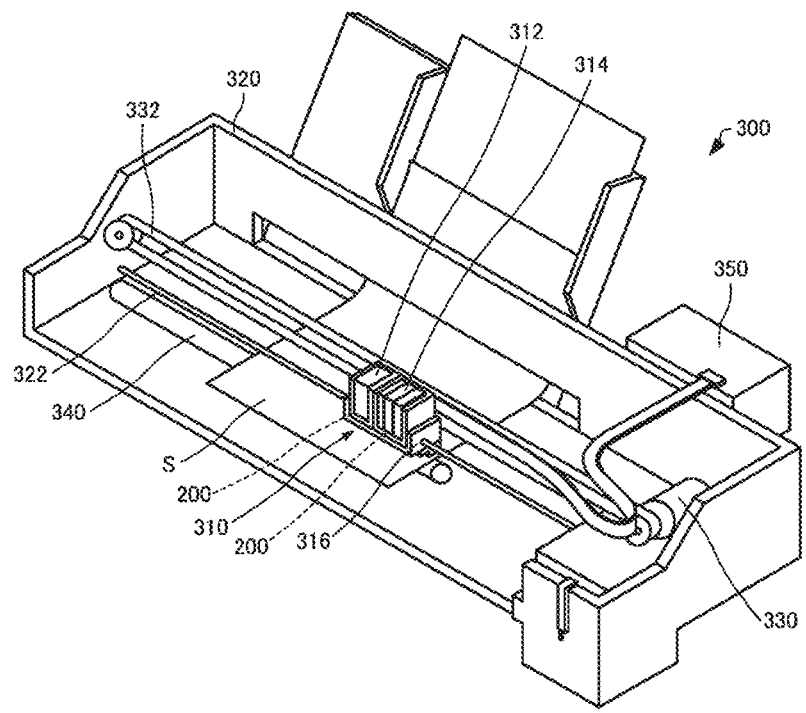
FIG. 6 is a perspective view schematically showing a printer according to the embodiment.

Next, a printer according to the present embodiment will be described with reference to the drawings. FIG. 6 is a perspective view schematically showing a printer 300 according to the present embodiment.

The printer 300 is an inkjet printer. The printer 300 includes a head unit 310 as shown in FIG. 6. The head unit 310 includes, for example, the liquid ejection heads 200. The number of liquid ejection heads 200 is not particularly limited. The head unit 310 is detachably provided with cartridges 312 and 314 that constitute a supply unit. A carriage 316 on which the head unit 310 is mounted is axially movable on a carriage shaft 322 attached to an apparatus main body 320, and ejects a liquid supplied from a liquid supply unit.

Here, the liquid may be any material which is a substance in a liquid phase, and a material in a liquid state such as a sol and a gel is also included in the liquid. In addition, the liquid includes not only a liquid as one state of a substance, but also those obtained by dissolving, dispersing, or mixing solid functional material particles such as pigments and metal particles in a solvent. Typical examples of the liquid include an ink and a liquid crystal emulsifier. The ink includes various liquid compositions such as a general water-based ink, an oil-based ink, a gel ink, and a hot-melt ink.

In the printer 300, a driving force of a driving motor 330 is transmitted to the carriage 316 via a plurality of gears (not shown) and a timing belt 332, and thus the carriage 316 on which the head unit 310 is mounted is moved along the carriage shaft 322. On the other hand, the apparatus main body 320 is provided with a conveyance roller 340 as a conveyance mechanism that relatively moves a sheet S, which is a recording medium such as paper, with respect to the liquid ejection head 200. The conveyance mechanism that conveys the sheet S is not limited to the conveyance roller, and may be a belt, a drum, and the like.

The printer 300 includes a printer controller 350 as a control unit that controls the liquid ejection heads 200 and the conveyance roller 340. The printer controller 350 is electrically coupled to the circuit substrate 250 of the liquid ejection head 200. The printer controller 350 includes, for example, a random access memory (RAM) that temporarily stores various data, a read only memory (ROM) that stores a control program or the like, a central processing unit (CPU), and a drive signal generation circuit that generates a drive signal to be supplied to the liquid ejection head 200.

The piezoelectric element 100 can be used in a wide range of applications, without being limited to a liquid ejection head and a printer. The piezoelectric element 100 is suitably used as a piezoelectric actuator for, for example, an ultrasonic motor, a vibrating dust remover, a piezoelectric transformer, a piezoelectric speaker, a piezoelectric pump, and a pressure-electrical conversion device. In addition, the piezoelectric element 100 is suitably used as a piezoelectric sensor element of such as an ultrasonic detector, an angular velocity sensor, an acceleration sensor, a vibration sensor, an inclination sensor, a pressure sensor, a collision sensor, a motion sensor, an infrared sensor, a terahertz sensor, a heat detection sensor, a pyroelectric sensor, and a piezoelectric sensor. In addition, the piezoelectric element 100 is suitably used as a ferroelectric element of such as a ferroelectric memory (FeRAM), a ferroelectric transistor (FeFET), a ferroelectric arithmetic circuit (FeLogic), and a ferroelectric capacitor. Further, the piezoelectric element 100 is suitably used as a voltage-controlled optical element of such as a wavelength converter, an optical waveguide, an optical path modulator, a refractive index control element, and an electronic shutter mechanism.

6. Example and Comparative Example

The present disclosure will be described in more detail below with reference to Example, and the present disclosure is not limited to these examples.

6.1. Production of Thin Film Piezoelectric Element According to Example

A thin film piezoelectric element according to Example was produced as follows.

First, a zirconium oxide film having a plane (100) on a surface thereof was formed by vapor deposition on a single crystal silicon substrate having a plane (100) on a surface thereof. Next, a platinum film having a plane (100) on a surface thereof was formed on the zirconium oxide film by a DC sputtering method.

Next, a SrRuO$_3$ film having a plane (100) on a surface thereof was formed on the platinum film by an RF sputtering method. The SrRuO$_3$ film corresponds to a seed layer. Next, a piezoelectric layer was formed on the SrRuO$_3$ film by a liquid phase method (chemical solution method). A method for forming the piezoelectric layer will be described below.

First, a metal complex containing potassium, a metal complex containing sodium, and a metal complex containing niobium were dissolved or dispersed in an organic solvent to prepare a precursor solution. The prepared precursor solution was applied onto the SrRuO$_3$ film by a spin coating method to form a precursor layer (application step). Next, the precursor layer was heated at 180° C. and dried for a certain period of time (drying step), and then the dried precursor layer was heated at 395° C. and held for a certain period of time, thereby degreasing the precursor layer (degreasing step). Next, the degreased precursor layer was heated at 750° C. and held at 750° C. for 3 minutes, thereby crystallizing the degreased precursor layer (firing step).

Through the above steps, the piezoelectric layer was formed on the SrRuO$_3$ film. The piezoelectric layer having a thickness of 1.2 μm was formed by repeating a series of steps from the application step to the firing step 40 times.

Next, an upper electrode was formed on the piezoelectric layer. The upper electrode is formed by, for example, film formation using a sputtering method or a vacuum deposition method, and patterning using photolithography and etching. An X-ray diffraction measurement was performed without forming the upper electrode.

6.2. Production of Thin Film Piezoelectric Element According to Comparative Example First, a SiO$_2$ film having a thickness of 1170 nm was formed by thermally oxidizing a surface of a single crystal silicon substrate having a plane (112) on the surface. Next, a Zr film having a thickness of 400 nm was formed by a DC sputtering method, and a ZrO$_2$ film was formed by heat treatment at 850° C. A Pt film having a thickness of 50 nm was formed on the ZrO$_2$ film by the DC sputtering method.

Next, a piezoelectric layer was formed by a liquid phase method in the same manner as in Example. A method for forming and patterning an upper electrode is the same as in Example. An X-ray diffraction measurement was performed without forming the upper electrode.

6.3. Method for Evaluating Piezoelectric Element

The thin film piezoelectric elements according to Example and Comparative Example were evaluated as follows.

(1) X-ray diffraction measurement: evaluation of (100) of KNN

Device: D8 DISCOVER (manufactured by Bruker AXS)
Conditions: a vacuum tube, Cu-Kα rays, a voltage of 50 kV, a current of 100 mA
  the KNN film surface is irradiated with X-rays in a direction perpendicular to the surface
  2θ-ω scan and Psi axis-direction scan (2) X-ray diffraction measurement: evaluation of (111) of KNN Device: D8 DISCOVER (manufactured by Bruker AXS)
Conditions: a vacuum tube, Cu-Kα rays, a voltage of 50 kV, a current of 100 mA
  a KNN film surface is irradiated with X-rays in a direction perpendicular to the surface
  2θ-ω scan and Psi axis-direction scan
  the KNN film surface is irradiated with X-rays at an angle of 54.7° from the direction perpendicular to the surface
  2θ-ω scan (3) Appearance evaluation (film formation cracking)
Device: metallographic microscope
Conditions: 50× to 1000×, bright field and dark field (4) Evaluation of piezoelectric characteristics (displacement amount)
Device: NLV-2500 (manufactured by Polytec), AFB3022C (manufactured by Textronix), HDO4024 (manufactured by Lecroy)
Conditions: 50 Hz, sin wave, $V_{HIGH}$=2 V to 40 V, $V_{Low}$=0 V (fixed)

6.4. Evaluation Result of Piezoelectric Element

Figure 7:
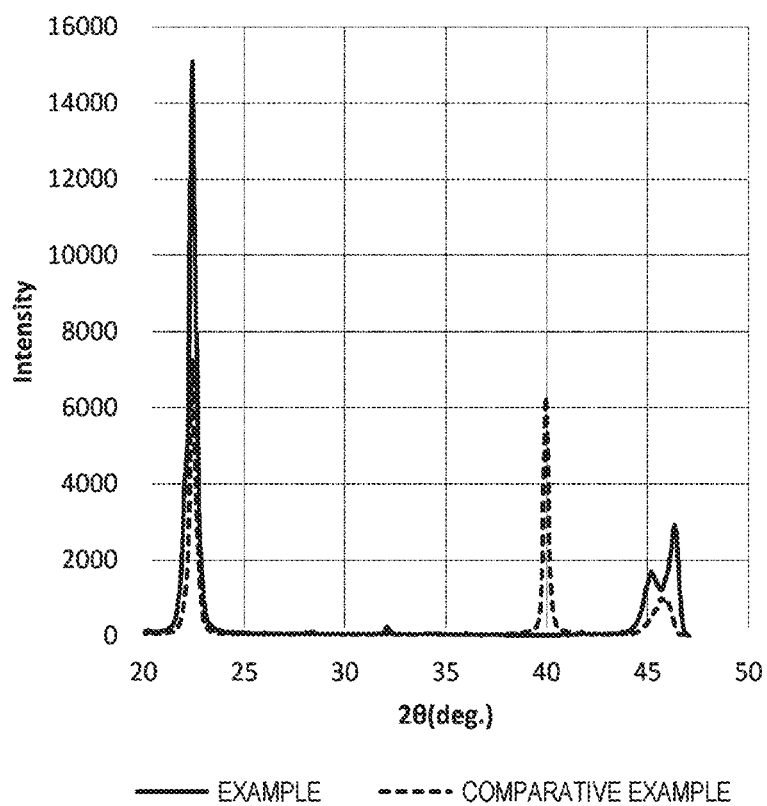
FIG. 7 shows 2θ scan results (for evaluating 100) of an X-ray diffraction measurement according to Example and Comparative Example.
Figure 8:
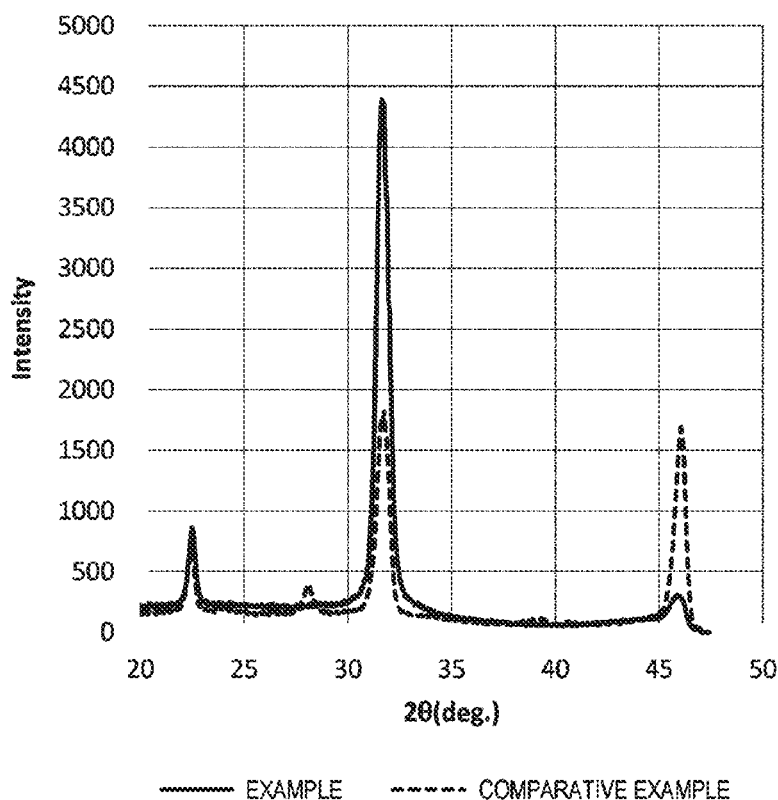
FIG. 8 shows 2θ scan results (for evaluating 111) of an X-ray diffraction measurement in which a KNN film surface is irradiated with X-rays at an angle of 54.74° from a direction perpendicular to the KNN film surface according to Example and Comparative Example.

FIG. 7 shows 2θ scan results (for evaluating 100) of a normal X-ray diffraction measurement according to Example and Comparative Example. FIG. 8 shows 2θ scan results (for evaluating 111) of an X-ray diffraction measurement in which X-rays are emitted at an angle of 54.7° according to Example and Comparative Example.

Referring to FIG. 7, a strong KNN (100) peak in the vicinity of 22.5° in the 2θ scan was found both in Example and Comparative Example. In addition, referring to FIG. 8, a peak corresponding to KNN (111) in the vicinity of 22.5° in the 2θ scan was found both in Example and Comparative Example. From these results, it was found that a KNN film having two orientations of (100) and (111) was basically obtained according to both Example and Comparative Example.

Figure 9:
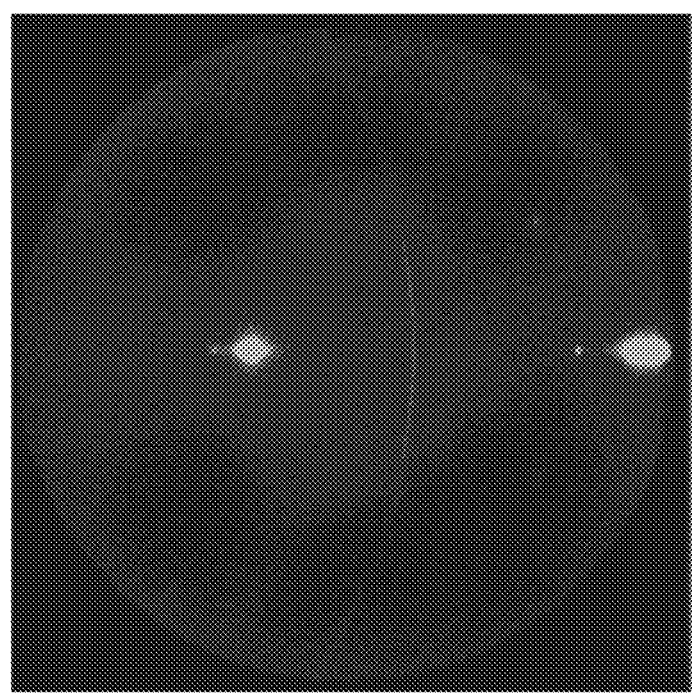
FIG. 9 shows a 2θ-ω two-dimensional mapping (for evaluating 100) of the X-ray diffraction measurement according to Example.
Figure 10:
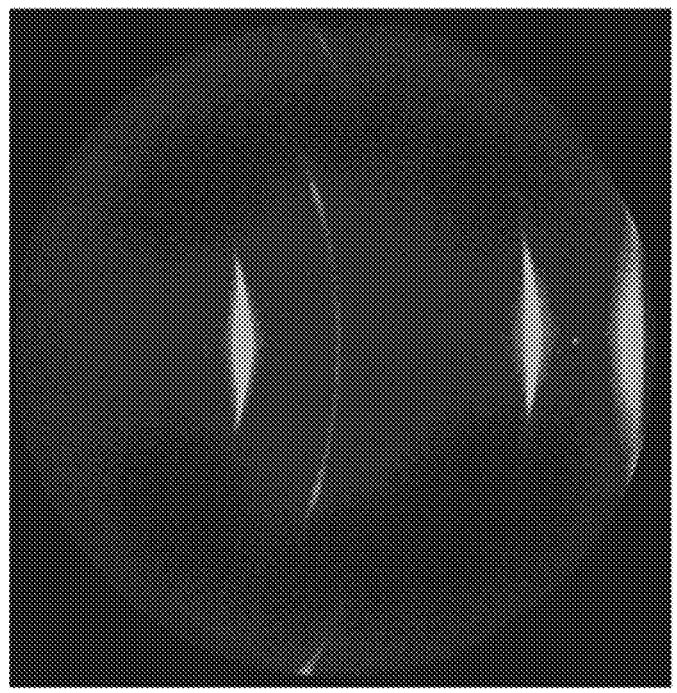
FIG. 10 shows a 2θ-ω two-dimensional mapping (for evaluating 100) of the X-ray diffraction measurement according to Comparative Example.
Figure 11:
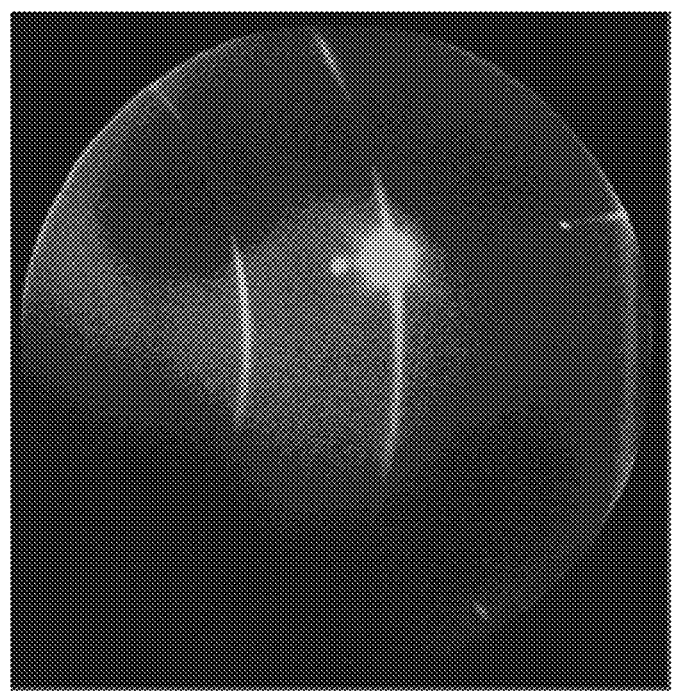
FIG. 11 shows a 2θ-ω two-dimensional mapping (for evaluating 111) of the X-ray diffraction measurement in which the KNN film surface is irradiated with X-rays at the angle of 54.74° from the direction perpendicular to the KNN film surface according to Example.
Figure 12:
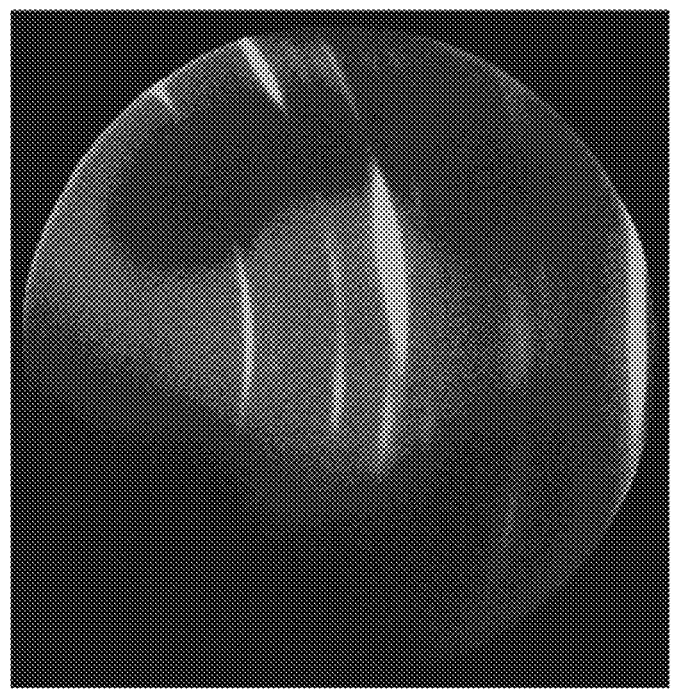
FIG. 12 shows a 2θ-ω two-dimensional mapping (for evaluating 111) of the X-ray diffraction measurement in which the KNN film surface is irradiated with X-rays at the angle of 54.74° from the direction perpendicular to the KNN film surface according to Comparative Example.

FIG. 9 shows a 2θ-ω two-dimensional mapping (for evaluating 100) of the X-ray diffraction measurement according to Example. FIG. 10 shows a 2θ-ω two-dimensional mapping (for evaluating 100) of the X-ray diffraction measurement according to Comparative Example. FIG. 11 shows a 2θ-ω two-dimensional mapping (for evaluating 111) of the X-ray diffraction measurement in which the KNN film surface is irradiated with X-rays at an angle of 54.74° from the direction perpendicular to the KNN film surface according to Example. FIG. 12 shows a 2θ-ω two-dimensional mapping (for evaluating 111) of the X-ray diffraction measurement in which the KNN film surface is irradiated with X-rays at an angle of 54.74° from the direction perpendicular to the KNN film surface according to Comparative Example.

It can be seen from FIGS. 9 and 10 that the expansion of the KNN (100) peak in a longitudinal direction is significantly different between Example and Comparative Example.

Figure 13:
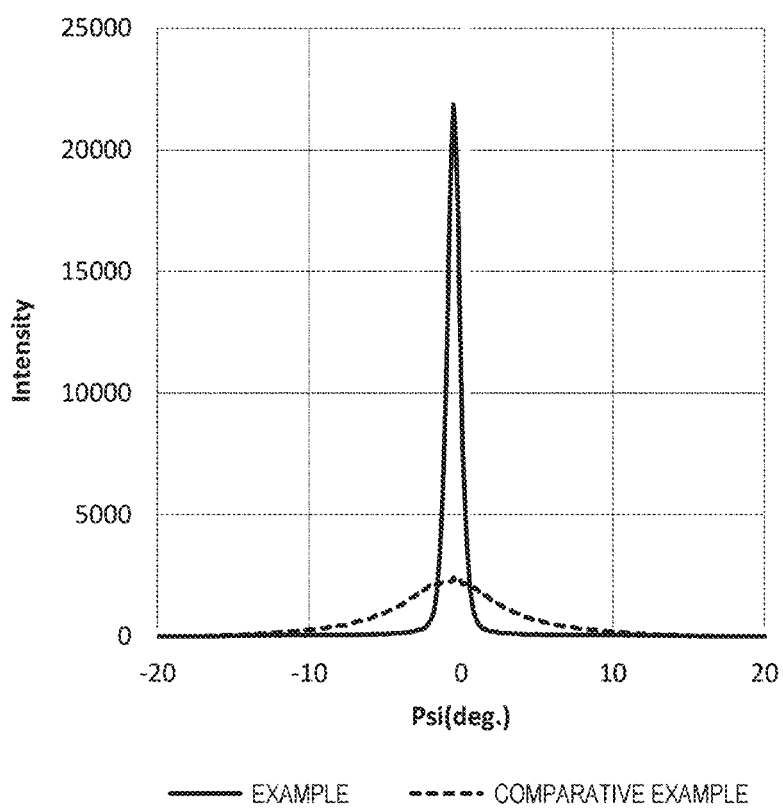
FIG. 13 shows Psi scan results (for evaluating 100) of a surface corresponding to (100) of the X-ray diffraction measurement in which the KNN film surface is irradiated with X-rays at the angle of 54.74° from the direction perpendicular to the KNN film surface according to Example and Comparative Example.

FIG. 13 shows Psi scan results (for evaluating 100) of the plane (100) of the X-ray diffraction measurement according to Example and Comparative Example. In FIG. 13, a longitudinal intensity changes of the KNN (100) peak in FIGS. 9 and 10 are plotted. As shown in FIG. 13, a large difference was observed between Example and Comparative Example. A full width at half maximum (FWHM) of an intensity distribution in FIG. 13 was 1.0° in Example and 7.3° in Comparative Example.

Figure 14:
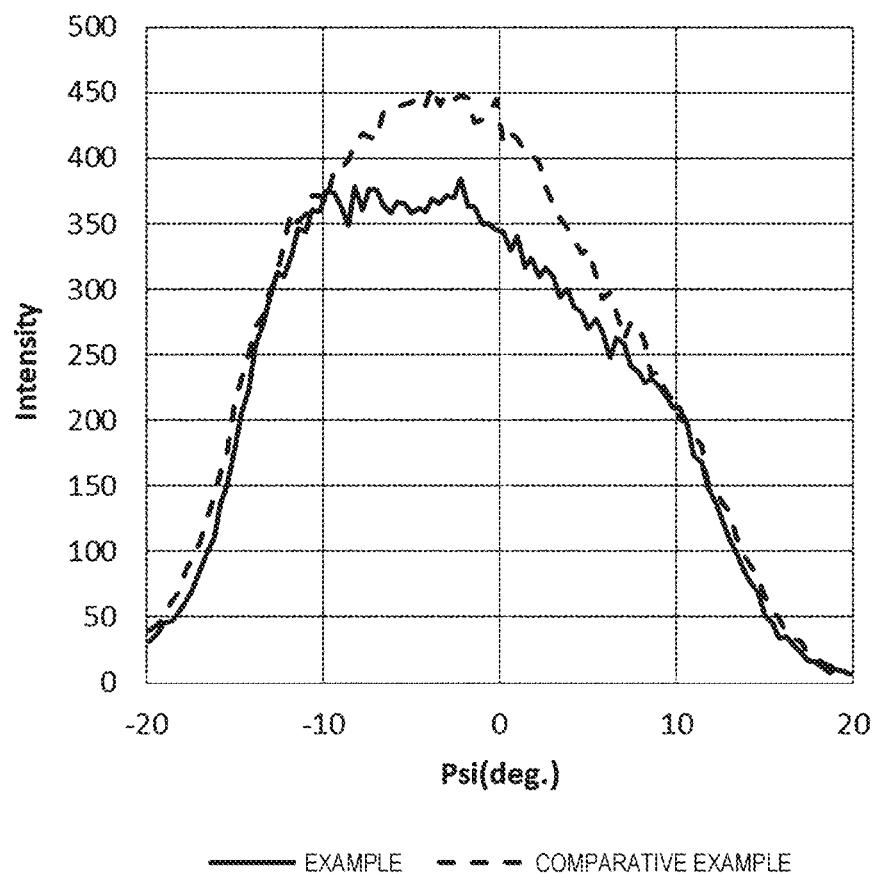
FIG. 14 shows Psi scan results (for evaluating 111) of a surface corresponding to (111) of the X-ray diffraction measurement in which the KNN film surface is irradiated with X-rays at the angle of 54.74° from the direction perpendicular to the KNN film surface according to Example and Comparative Example.

FIG. 14 shows Psi scan results (for evaluating 111) corresponding to the plane (111) of the X-ray diffraction measurement in which the KNN film surface is irradiated with X-rays at an angle of 54.74° from the direction perpendicular to the KNN film surface according to Example and Comparative Example. In FIG. 14, longitudinal intensity changes of a peak corresponding to KNN (111) in FIGS. 11 and 12 are plotted. As shown in FIG. 14, although there is no significant difference between Example and Comparative Example, the longitudinal intensity change was slightly reduced in Example. The full width at half maximum (FWHM) of an intensity distribution in FIG. 14 was 24.7° in Example and 22.7° in Comparative Example.

In Example, the film formation cracking did not occur, but in Comparative Example, the film formation cracking occurred when the KNN film was formed to a thickness of 0.67 μm. Further, the piezoelectric characteristics were $d_{31}$=76 pm/V in Example, and the piezoelectric characteristics cannot be evaluated in Comparative Example.

Figure 15:
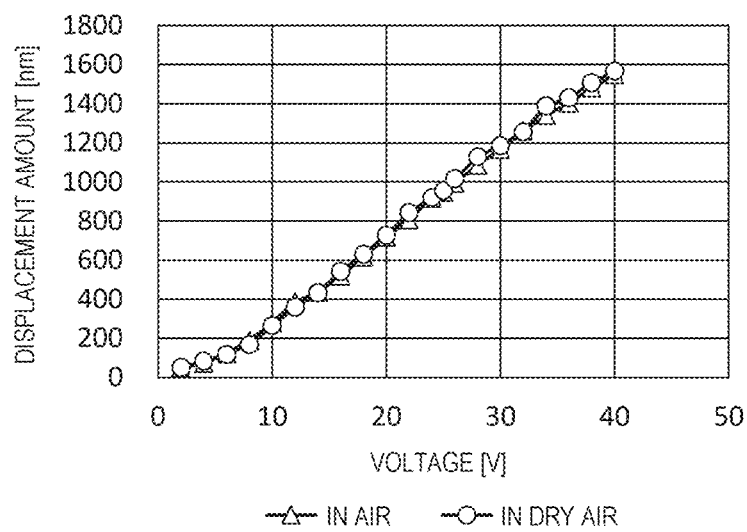
FIG. 15 shows a displacement amount evaluation result according to Example.

FIG. 15 shows a displacement amount evaluation result according to Example. It can be seen from FIG. 15 that the piezoelectric element according to Example exhibits good displacement characteristics both in the air and in dry air.

The above embodiments and modifications are examples, and the present disclosure is not limited thereto. For example, the embodiments and the modifications can also be appropriately combined.

The present disclosure includes a configuration substantially the same as the configuration described in the embodiment, for example, a configuration having the same function, method, and result, or a configuration having the same purpose and effect. In addition, the present disclosure includes a configuration obtained by replacing a non-essential portion of the configuration described in the embodiment. In addition, the present disclosure includes a configuration having the same function and effect as the configuration described in the embodiment, or a configuration capable of achieving the same purpose. Further, the present disclosure includes a configuration in which a known technique is added to the configuration described in the embodiment.

The following contents are derived from the above embodiments and modifications.

A piezoelectric substrate includes: a substrate; a first electrode formed on the substrate; and a piezoelectric layer formed on the first electrode and containing potassium, sodium, and niobium. A full width at half maximum of an X-ray intensity peak on a plane (100) of the piezoelectric layer in a Psi axis-direction scan result of an X-ray diffraction measurement in which a surface of the piezoelectric layer is irradiated with X-rays at an angle of 54.74° from a direction perpendicular to the surface is more than 0° and 1.2° or less.

According to the piezoelectric substrate, since the full width at half maximum of the X-ray intensity peak on the plane (100) of the piezoelectric layer is more than 0° and 1.2° or less, a crystal surface is densely formed and an amount of components having other orientations is small. Accordingly, a difference in thermal expansion coefficients due to a crystal orientation direction is small, a stress due to the difference in the thermal expansion coefficients at a time of temperature change is less likely to be generated, and breakage and cracking are less likely to occur. In addition, good piezoelectric characteristics can also be exhibited in the air atmosphere.

In the above piezoelectric substrate, a full width at half maximum of an X-ray intensity peak on the plane (100) of the piezoelectric layer in a 2θ-ω scan result of the X-ray diffraction measurement may be 0.3° or more and 0.5° or less.

According to the piezoelectric substrate, variation in a lattice constant of the crystal is small, and a displacement amount in a case of a piezoelectric element can be further improved.

The above piezoelectric substrate may further include a seed layer disposed between the first electrode and the piezoelectric layer and containing strontium and ruthenium.

According to the piezoelectric substrate, an effect that the stress due to the difference in the thermal expansion coefficients is less likely to be generated, and breakage and cracking are less likely to occur is more remarkably shown.

In the above piezoelectric substrate, a full width at half maximum of an X-ray intensity peak on a plane (111) of the piezoelectric layer in the Psi axis-direction scan result of the X-ray diffraction measurement in which the surface of the piezoelectric layer is irradiated with X-rays at the angle of 54.74° from the direction perpendicular to the surface may be more than 23°.

According to the above piezoelectric substrate, since a strain due to a difference in the lattice constants can be appropriately relaxed, the effect that the stress is less likely to be generated and the breakage and the cracking are less likely to occur is more remarkably shown.

In the above piezoelectric substrate, a full width at half maximum of an X-ray intensity peak on a plane (111) of the piezoelectric layer in a 2θ-ω scan result of the X-ray diffraction measurement in which the surface of the piezoelectric layer is irradiated with X-rays at the angle of 54.74° from the direction perpendicular to the surface may be 0.3° or more and 0.5° or less.

According to the piezoelectric substrate, the effect that the stress due to the difference in the thermal expansion coefficients is less likely to be generated, and the breakage and the cracking are less likely to occur is more remarkably shown.

A piezoelectric element includes: the above piezoelectric substrate; and a second electrode formed on the piezoelectric layer.

According to the piezoelectric element, a crystal surface of a piezoelectric material is densely formed and an amount of components having other orientations is small. Accordingly, a difference in thermal expansion coefficients due to a crystal orientation direction is small, a stress due to the difference in the thermal expansion coefficients at a time of temperature change is less likely to be generated, and breakage and cracking are less likely to occur, resulting in high reliability.

A liquid ejection head includes: the above piezoelectric element; a flow path formation substrate provided with a pressure generation chamber whose capacity is changed by the piezoelectric element; and a nozzle plate provided with a nozzle hole that is in communication with the pressure generation chamber.

According to the liquid ejection head, since the piezoelectric element in which the crystal surface of the piezoelectric material is densely formed and in which an amount of components having other orientations is small is used, a stress due to a difference in thermal expansion coefficients at a time of temperature change is less likely to be generated, and breakage and cracking are less likely to occur, resulting in high reliability.

What is claimed is:

1. A piezoelectric substrate, comprising:
   a substrate;
   a first electrode formed on the substrate; and
   a piezoelectric layer formed on the first electrode and containing potassium, sodium, and niobium, wherein a full width at half maximum of an X-ray intensity peak on a plane (100) of the piezoelectric layer in a Psi axis-direction scan result of an X-ray diffraction measurement in which a surface of the piezoelectric layer is irradiated with X-rays at an angle of 54.74° from a direction perpendicular to the surface is more than 0° and 1.2° or less.

2. The piezoelectric substrate according to claim 1, wherein
   a full width at half maximum of an X-ray intensity peak on the plane (100) of the piezoelectric layer in a 2θ-ω scan result of the X-ray diffraction measurement is 0.3° or more and 0.5° or less.

3. The piezoelectric substrate according to claim 1, further comprising:
   a seed layer disposed between the first electrode and the piezoelectric layer and containing strontium and ruthenium.

4. The piezoelectric substrate according to claim 1, wherein
   a full width at half maximum of an X-ray intensity peak on a plane (111) of the piezoelectric layer in the Psi axis-direction scan result of the X-ray diffraction measurement in which the surface of the piezoelectric layer is irradiated with X-rays at the angle of 54.74° from the direction perpendicular to the surface is more than 23°.

5. The piezoelectric substrate according to claim 1, wherein
   a full width at half maximum of an X-ray intensity peak on a plane (111) of the piezoelectric layer in a 2θ-ω scan result of the X-ray diffraction measurement in which the surface of the piezoelectric layer is irradiated with X-rays at the angle of 54.74° from the direction perpendicular to the surface is 0.3° or more and 0.5° or less.

6. A piezoelectric element, comprising:
   the piezoelectric substrate according to claim 1; and
   a second electrode formed on the piezoelectric layer.

7. A liquid ejection head, comprising:
   the piezoelectric element according to claim 6;
   a flow path formation substrate provided with a pressure generation chamber whose capacity is changed by the piezoelectric element; and
   a nozzle plate provided with a nozzle hole that is in communication with the pressure generation chamber.

* * * * *